(12) United States Patent
Yamazaki et al.

(10) Patent No.: US 9,123,595 B2
(45) Date of Patent: Sep. 1, 2015

(54) METHOD FOR FABRICATING A SEMICONDUCTOR DEVICE BY BONDING A LAYER TO A SUPPORT WITH CURVATURE

(71) Applicant: Semiconductor Energy Laboratory Co., Ltd., Atsugi-shi, Kanagawa-ken (JP)

(72) Inventors: Shunpei Yamazaki, Tokyo (JP); Masakazu Murakami, Kanagawa (JP); Toru Takayama, Kanagawa (JP); Junya Maruyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/103,994

(22) Filed: Dec. 12, 2013

(65) Prior Publication Data

US 2014/0099742 A1    Apr. 10, 2014

Related U.S. Application Data

(63) Continuation of application No. 13/729,473, filed on Dec. 28, 2012, now Pat. No. 8,610,118, which is a continuation of application No. 12/978,758, filed on Dec. 27, 2010, now Pat. No. 8,344,369, which is a (Continued)

(30) Foreign Application Priority Data

Dec. 28, 2001    (JP) .................................. 2001-402016

(51) Int. Cl.
*H01L 21/58*     (2006.01)
*H01L 33/20*     (2010.01)

(Continued)

(52) U.S. Cl.
CPC ....... *H01L 27/1259* (2013.01); *G02F 1/133305* (2013.01); *H01L 21/2007* (2013.01); *H01L 21/67092* (2013.01); *H01L 21/6835* (2013.01); *H01L 21/76251* (2013.01);

(Continued)

(58) Field of Classification Search
USPC .................................. 438/458; 257/E33.006
See application file for complete search history.

(56) References Cited

U.S. PATENT DOCUMENTS

| | | | |
|---|---|---|---|
| 4,717,790 A | 1/1988 | Gochermann |
| 4,883,561 A | 11/1989 | Gmitter et al. |

(Continued)

FOREIGN PATENT DOCUMENTS

| | | | |
|---|---|---|---|
| EP | 0 853 254 A2 | 7/1998 |
| EP | 0 858 110 A1 | 8/1998 |

(Continued)

*Primary Examiner* — Stephen W Smoot
(74) *Attorney, Agent, or Firm* — Fish & Richardson P.C.

(57) ABSTRACT

The object of the invention is to provide a method for fabricating a semiconductor device having a peeled layer bonded to a base material with curvature. Particularly, the object is to provide a method for fabricating a display with curvature, more specifically, a light emitting device having an OLED bonded to a base material with curvature. An external force is applied to a support originally having curvature and elasticity, and the support is bonded to a peeled layer formed over a substrate. Then, when the substrate is peeled, the support returns into the original shape by the restoring force, and the peeled layer as well is curved along the shape of the support. Finally, a transfer object originally having curvature is bonded to the peeled layer, and then a device with a desired curvature is completed.

15 Claims, 8 Drawing Sheets

Related U.S. Application Data continuation of application No. 12/259,748, filed on Oct. 28, 2008, now Pat. No. 7,858,411, which is a continuation of application No. 11/422,980, filed on Jun. 8, 2006, now Pat. No. 7,446,339, which is a continuation of application No. 11/079,287, filed on Mar. 15, 2005, now Pat. No. 7,060,591, which is a continuation of application No. 10/334,076, filed on Dec. 27, 2002, now Pat. No. 6,953,735.

(51) Int. Cl.
| | |
|---|---|
| H01L 21/67 | (2006.01) |
| H01L 51/00 | (2006.01) |
| H01L 27/12 | (2006.01) |
| H01L 21/762 | (2006.01) |
| H01L 29/786 | (2006.01) |
| H01L 29/66 | (2006.01) |
| H01L 21/20 | (2006.01) |
| H01L 21/683 | (2006.01) |
| H01L 27/15 | (2006.01) |
| G02F 1/1333 | (2006.01) |
| H01L 51/56 | (2006.01) |
| H01L 27/32 | (2006.01) |

(52) U.S. Cl.
CPC ....... *H01L 27/1214* (2013.01); *H01L 27/1266* (2013.01); *H01L 27/156* (2013.01); *H01L 29/66757* (2013.01); *H01L 29/78603* (2013.01); *H01L 51/0097* (2013.01); *H01L 27/3244* (2013.01); *H01L 51/003* (2013.01); *H01L 51/0024* (2013.01); *H01L 51/56* (2013.01); *H01L 2221/6835* (2013.01); *H01L 2221/68363* (2013.01); *H01L 2227/326* (2013.01); *H01L 2924/3025* (2013.01); *H01L 2924/30105* (2013.01); *Y02E 10/549* (2013.01)
USPC .................... 438/458; 438/149; 257/E33.006

(56) References Cited

U.S. PATENT DOCUMENTS

| | | | |
|---|---|---|---|
| 5,206,749 A | 4/1993 | Zavracky et al. |
| 5,256,562 A | 10/1993 | Vu et al. |
| 5,258,320 A | 11/1993 | Zavracky et al. |
| 5,273,475 A | 12/1993 | Oshikawa |
| 5,300,788 A | 4/1994 | Fan et al. |
| 5,317,236 A | 5/1994 | Zavracky et al. |
| 5,317,436 A | 5/1994 | Spitzer et al. |
| 5,331,149 A | 7/1994 | Spitzer et al. |
| 5,362,671 A | 11/1994 | Zavracky et al. |
| 5,376,561 A | 12/1994 | Vu et al. |
| 5,376,979 A | 12/1994 | Zavracky et al. |
| 5,377,031 A | 12/1994 | Vu et al. |
| 5,396,304 A | 3/1995 | Salerno et al. |
| 5,420,055 A | 5/1995 | Vu et al. |
| 5,438,241 A | 8/1995 | Zavracky et al. |
| 5,444,557 A | 8/1995 | Spitzer et al. |
| 5,453,405 A | 9/1995 | Fan et al. |
| 5,467,154 A | 11/1995 | Gale et al. |
| 5,475,514 A | 12/1995 | Salerno et al. |
| 5,499,124 A | 3/1996 | Vu et al. |
| 5,528,397 A | 6/1996 | Zavracky et al. |
| 5,539,550 A | 7/1996 | Spitzer et al. |
| 5,578,865 A | 11/1996 | Vu et al. |
| 5,581,385 A | 12/1996 | Spitzer et al. |
| 5,583,335 A | 12/1996 | Spitzer et al. |
| 5,589,406 A | 12/1996 | Kato et al. |
| 5,650,363 A | 7/1997 | Endroes et al. |
| 5,661,371 A | 8/1997 | Salerno et al. |
| 5,666,175 A | 9/1997 | Spitzer et al. |
| 5,674,304 A | 10/1997 | Fukada et al. |
| 5,692,820 A | 12/1997 | Gale et al. |
| 5,702,963 A | 12/1997 | Vu et al. |
| 5,705,424 A | 1/1998 | Zavracky et al. |
| 5,713,652 A | 2/1998 | Zavracky et al. |
| 5,736,768 A | 4/1998 | Zavracky et al. |
| 5,743,614 A | 4/1998 | Salerno et al. |
| 5,751,261 A | 5/1998 | Zavracky et al. |
| 5,757,445 A | 5/1998 | Vu et al. |
| 5,757,456 A | 5/1998 | Yamazaki et al. |
| 5,789,763 A | 8/1998 | Kato et al. |
| 5,807,440 A | 9/1998 | Kubota et al. |
| 5,817,548 A | 10/1998 | Noguchi et al. |
| 5,821,138 A | 10/1998 | Yamazaki et al. |
| 5,834,327 A | 11/1998 | Yamazaki et al. |
| 5,851,862 A | 12/1998 | Ohtani et al. |
| 5,861,929 A | 1/1999 | Spitzer |
| 5,879,741 A | 3/1999 | Itoh |
| 5,883,437 A | 3/1999 | Maruyama et al. |
| 5,929,961 A | 7/1999 | Nishi et al. |
| 5,943,593 A | 8/1999 | Noguchi et al. |
| 5,956,181 A | 9/1999 | Lin |
| 5,981,306 A | 11/1999 | Burrows et al. |
| 5,990,542 A | 11/1999 | Yamazaki |
| 6,013,346 A | 1/2000 | Lewis et al. |
| 6,013,982 A | 1/2000 | Thompson et al. |
| 6,020,271 A | 2/2000 | Yanagida |
| 6,027,958 A | 2/2000 | Vu et al. |
| 6,043,800 A | 3/2000 | Spitzer et al. |
| 6,059,913 A | 5/2000 | Asmussen et al. |
| 6,072,445 A | 6/2000 | Spitzer et al. |
| 6,096,581 A | 8/2000 | Zhang et al. |
| 6,118,502 A | 9/2000 | Yamazaki et al. |
| 6,121,950 A | 9/2000 | Zavracky et al. |
| 6,127,199 A | 10/2000 | Inoue et al. |
| 6,133,071 A | 10/2000 | Nagai |
| 6,140,980 A | 10/2000 | Spitzer et al. |
| 6,143,582 A | 11/2000 | Vu et al. |
| 6,160,346 A | 12/2000 | Vleggaar et al. |
| 6,190,937 B1 | 2/2001 | Nakagawa et al. |
| 6,232,136 B1 | 5/2001 | Zavracky et al. |
| 6,239,470 B1 | 5/2001 | Yamazaki |
| 6,245,393 B1 | 6/2001 | Thompson et al. |
| 6,246,169 B1 | 6/2001 | Pruvot |
| 6,261,634 B1 | 7/2001 | Itoh |
| 6,300,612 B1 | 10/2001 | Yu |
| 6,310,362 B1 | 10/2001 | Takemura |
| 6,317,175 B1 | 11/2001 | Salerno et al. |
| 6,320,568 B1 | 11/2001 | Zavracky |
| 6,320,640 B2 | 11/2001 | Nishi et al. |
| 6,339,010 B2 | 1/2002 | Sameshima |
| 6,362,866 B1 | 3/2002 | Yamazaki et al. |
| 6,372,608 B1 | 4/2002 | Shimoda et al. |
| 6,376,333 B1 | 4/2002 | Yamazaki et al. |
| 6,403,985 B1 | 6/2002 | Fan et al. |
| 6,414,783 B2 | 7/2002 | Zavracky et al. |
| 6,424,020 B1 | 7/2002 | Vu et al. |
| 6,441,468 B1 | 8/2002 | Yamazaki |
| 6,455,397 B1 | 9/2002 | Belford |
| 6,486,929 B1 | 11/2002 | Vu et al. |
| 6,498,114 B1 | 12/2002 | Amundson et al. |
| 6,504,524 B1 | 1/2003 | Gates et al. |
| 6,506,438 B2 | 1/2003 | Duthaler et al. |
| 6,506,664 B1 | 1/2003 | Beyne et al. |
| 6,511,187 B1 | 1/2003 | Salerno et al. |
| 6,512,624 B2 | 1/2003 | Tonar et al. |
| 6,515,417 B1 | 2/2003 | Duggal et al. |
| 6,521,511 B1 | 2/2003 | Inoue et al. |
| 6,521,940 B1 | 2/2003 | Vu et al. |
| 6,531,997 B1 | 3/2003 | Gates et al. |
| 6,544,430 B2 | 4/2003 | McCormack et al. |
| 6,558,008 B1 | 5/2003 | Salerno et al. |
| 6,566,808 B1 | 5/2003 | Duggal et al. |
| 6,579,422 B1 | 6/2003 | Kakinuma |
| 6,582,996 B1 | 6/2003 | Hara et al. |
| 6,593,978 B2 | 7/2003 | Vu et al. |
| 6,608,654 B2 | 8/2003 | Zavracky et al. |
| 6,627,518 B1 | 9/2003 | Inoue et al. |
| 6,627,953 B1 | 9/2003 | Vu et al. |
| 6,632,708 B2 | 10/2003 | Sakama et al. |
| 6,636,185 B1 | 10/2003 | Spitzer et al. |

(56) References Cited

U.S. PATENT DOCUMENTS

| | | |
|---|---|---|
| 6,642,542 B1 | 11/2003 | Shimoda et al. |
| 6,645,830 B2 | 11/2003 | Shimoda et al. |
| 6,649,433 B2 | 11/2003 | Mikhael et al. |
| 6,661,029 B1 | 12/2003 | Duggal |
| 6,664,730 B2 | 12/2003 | Weaver |
| 6,682,963 B2 | 1/2004 | Ishikawa |
| 6,683,333 B2 | 1/2004 | Kazlas et al. |
| RE38,466 E | 3/2004 | Inoue et al. |
| 6,700,322 B1 | 3/2004 | Duggal et al. |
| 6,700,631 B1 | 3/2004 | Inoue et al. |
| 6,707,160 B2 | 3/2004 | Yamaji |
| 6,737,753 B2 | 5/2004 | Kumar et al. |
| 6,753,212 B2 | 6/2004 | Yamazaki et al. |
| 6,777,871 B2 | 8/2004 | Duggal et al. |
| 6,781,152 B2 | 8/2004 | Yamazaki |
| 6,800,999 B1 | 10/2004 | Duggal et al. |
| 6,814,832 B2 | 11/2004 | Utsunomiya |
| 6,818,530 B2 | 11/2004 | Shimoda et al. |
| 6,821,553 B2 | 11/2004 | Miyashita et al. |
| 6,833,156 B2 | 12/2004 | Miyashita et al. |
| 6,838,192 B2 | 1/2005 | Miyashita et al. |
| 6,841,949 B2 | 1/2005 | Duggal |
| 6,863,961 B2 | 3/2005 | Miyashita et al. |
| 6,867,539 B1 | 3/2005 | McCormick et al. |
| 6,878,607 B2 | 4/2005 | Inoue et al. |
| 6,885,389 B2 | 4/2005 | Inoue et al. |
| 6,919,935 B2 | 7/2005 | Vu et al. |
| 6,940,223 B2 | 9/2005 | Yamazaki |
| 6,945,678 B2 | 9/2005 | Sugihara et al. |
| 6,946,361 B2 | 9/2005 | Takayama et al. |
| 6,953,735 B2 | 10/2005 | Yamazaki et al. |
| 6,965,195 B2 | 11/2005 | Yamazaki et al. |
| 6,967,114 B2 | 11/2005 | Shimoda et al. |
| 6,974,731 B2 | 12/2005 | Yamazaki et al. |
| 6,998,282 B1 | 2/2006 | Yamazaki et al. |
| 7,045,438 B2 | 5/2006 | Yamazaki et al. |
| 7,045,442 B2 | 5/2006 | Maruyama et al. |
| 7,050,138 B1 | 5/2006 | Yamazaki et al. |
| 7,060,153 B2 | 6/2006 | Yamazaki et al. |
| 7,060,591 B2 | 6/2006 | Yamazaki et al. |
| 7,075,501 B1 | 7/2006 | Spitzer et al. |
| 7,094,665 B2 | 8/2006 | Shimoda et al. |
| 7,119,364 B2 | 10/2006 | Yamazaki |
| 7,122,445 B2 | 10/2006 | Takayama et al. |
| 7,180,091 B2 | 2/2007 | Yamazaki et al. |
| 7,189,631 B2 | 3/2007 | Yamazaki et al. |
| 7,198,393 B2 | 4/2007 | Tubidis et al. |
| 7,198,533 B2 | 4/2007 | Duggal et al. |
| 7,214,555 B2 | 5/2007 | Yamazaki et al. |
| 7,271,858 B2 | 9/2007 | Yamazaki et al. |
| 7,285,476 B2 | 10/2007 | Shimoda et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,361,519 B2 | 4/2008 | Yamazaki et al. |
| 7,375,782 B2 | 5/2008 | Yamazaki et al. |
| 7,425,931 B1 | 9/2008 | Yamazaki et al. |
| 7,442,957 B2 | 10/2008 | Yamazaki et al. |
| 7,446,339 B2 | 11/2008 | Yamazaki et al. |
| 7,446,843 B2 | 11/2008 | Yamazaki et al. |
| RE40,601 E | 12/2008 | Inoue et al. |
| 7,483,091 B1 | 1/2009 | Yamazaki et al. |
| 7,777,409 B2 | 8/2010 | Yamazaki et al. |
| 7,825,002 B2 | 11/2010 | Takayama et al. |
| 7,862,677 B2 | 1/2011 | Nakajima et al. |
| 8,367,440 B2 | 2/2013 | Takayama et al. |
| 8,415,208 B2 | 4/2013 | Takayama et al. |
| 2001/0001050 A1 | 5/2001 | Miyashita et al. |
| 2001/0009691 A1 | 7/2001 | Thompson et al. |
| 2001/0030871 A1 | 10/2001 | Anderson, Jr. et al. |
| 2001/0033135 A1 | 10/2001 | Duggal et al. |
| 2001/0033347 A1 | 10/2001 | Kitahora et al. |
| 2001/0035863 A1 | 11/2001 | Kimura |
| 2001/0040645 A1 | 11/2001 | Yamazaki |
| 2002/0003201 A1 | 1/2002 | Yu |
| 2002/0030189 A1 | 3/2002 | Ishikawa |
| 2002/0041926 A1 | 4/2002 | Miyashita et al. |
| 2002/0050958 A1 | 5/2002 | Matthies et al. |
| 2002/0136823 A1 | 9/2002 | Miyashita et al. |
| 2002/0146893 A1 | 10/2002 | Shimoda et al. |
| 2002/0155215 A1 | 10/2002 | Miyashita et al. |
| 2002/0190661 A1 | 12/2002 | Duggal et al. |
| 2003/0008437 A1 | 1/2003 | Inoue et al. |
| 2003/0020084 A1 | 1/2003 | Fan et al. |
| 2003/0024635 A1 | 2/2003 | Utsunomiya |
| 2003/0025146 A1 | 2/2003 | Narwankar et al. |
| 2003/0032210 A1 | 2/2003 | Takayama et al. |
| 2003/0040164 A1 | 2/2003 | Inoue et al. |
| 2003/0047280 A1 | 3/2003 | Takayama et al. |
| 2003/0047732 A1 | 3/2003 | Yamazaki et al. |
| 2003/0054186 A1 | 3/2003 | Miyashita et al. |
| 2003/0057425 A1 | 3/2003 | Zavracky et al. |
| 2003/0059990 A1 | 3/2003 | Yamazaki |
| 2003/0062845 A1 | 4/2003 | Yamazaki et al. |
| 2003/0064569 A1 | 4/2003 | Takayama et al. |
| 2003/0068525 A1 | 4/2003 | Bellmann et al. |
| 2003/0071953 A1 | 4/2003 | Yamazaki et al. |
| 2003/0075733 A1 | 4/2003 | Yamazaki et al. |
| 2003/0082889 A1 | 5/2003 | Maruyama et al. |
| 2003/0100169 A1 | 5/2003 | Tanaka et al. |
| 2003/0117369 A1 | 6/2003 | Spitzer et al. |
| 2003/0162312 A1 | 8/2003 | Takayama et al. |
| 2003/0197197 A1 | 10/2003 | Brown et al. |
| 2003/0217805 A1 | 11/2003 | Takayama et al. |
| 2003/0224582 A1 | 12/2003 | Shimoda et al. |
| 2004/0056180 A1 | 3/2004 | Yu |
| 2004/0085292 A1 | 5/2004 | Spitzer et al. |
| 2004/0087110 A1 | 5/2004 | Takayama et al. |
| 2004/0106237 A1 | 6/2004 | Yamazaki |
| 2004/0132265 A1 | 7/2004 | Maruyama et al. |
| 2004/0219762 A1 | 11/2004 | Shimoda et al. |
| 2004/0232413 A1 | 11/2004 | Yamazaki et al. |
| 2005/0017255 A1 | 1/2005 | Yamazaki |
| 2005/0042477 A1 | 2/2005 | Miyashita et al. |
| 2005/0062412 A1 | 3/2005 | Taniguchi et al. |
| 2006/0125410 A1 | 6/2006 | Duggal et al. |
| 2007/0010067 A1 | 1/2007 | Shimoda et al. |
| 2007/0082430 A1 | 4/2007 | Yamazaki |
| 2007/0212853 A1 | 9/2007 | Maruyama et al. |
| 2007/0222397 A1 | 9/2007 | Shiang et al. |
| 2008/0049437 A1 | 2/2008 | Takayama et al. |
| 2008/0188022 A1 | 8/2008 | Yamazaki et al. |
| 2008/0309585 A1 | 12/2008 | Yamazaki et al. |
| 2009/0108263 A1 | 4/2009 | Yamazaki et al. |
| 2009/0185130 A1 | 7/2009 | Yamazaki et al. |
| 2009/0239320 A1 | 9/2009 | Takayama et al. |
| 2009/0291516 A1 | 11/2009 | Takayama et al. |

FOREIGN PATENT DOCUMENTS

| | | |
|---|---|---|
| EP | 0 880 303 A1 | 11/1998 |
| EP | 0 909 972 A2 | 4/1999 |
| EP | 0 917 409 A1 | 5/1999 |
| EP | 0 924 769 A1 | 6/1999 |
| EP | 0 935 389 A1 | 8/1999 |
| EP | 1003354 A | 5/2000 |
| EP | 1 014 452 A1 | 6/2000 |
| EP | 1 111 966 A2 | 6/2001 |
| EP | 1115268 A | 7/2001 |
| EP | 1 120 838 A2 | 8/2001 |
| EP | 1 121 000 A1 | 8/2001 |
| EP | 1 122 794 A1 | 8/2001 |
| EP | 1 211 916 A1 | 6/2002 |
| EP | 1 237 191 A1 | 9/2002 |
| EP | 1 351 308 A1 | 10/2003 |
| EP | 1 376 716 A2 | 1/2004 |
| EP | 1 376 717 A2 | 1/2004 |
| EP | 1448026 A | 8/2004 |
| EP | 1624485 A | 2/2006 |
| EP | 1 655 633 A2 | 5/2006 |
| EP | 1 686 626 A1 | 8/2006 |
| EP | 1 744 365 A2 | 1/2007 |
| EP | 1 758 169 A2 | 2/2007 |
| JP | 62-108581 A | 5/1987 |

(56) References Cited

FOREIGN PATENT DOCUMENTS

| | | | |
|---|---|---|---|
| JP | 01-287529 A | 11/1989 |
| JP | 02-250031 A | 10/1990 |
| JP | 03-065925 A | 3/1991 |
| JP | 04-043389 A | 2/1992 |
| JP | 05-090623 A | 4/1993 |
| JP | 05-127154 A | 5/1993 |
| JP | 06-504139 A | 5/1994 |
| JP | 06-214220 A | 8/1994 |
| JP | 07-092501 A | 4/1995 |
| JP | 08-288522 A | 11/1996 |
| JP | 09-022026 A | 1/1997 |
| JP | 09-297316 A | 11/1997 |
| JP | 10-020293 A | 1/1998 |
| JP | 10-095189 A | 4/1998 |
| JP | 10-125929 A | 5/1998 |
| JP | 10-125930 A | 5/1998 |
| JP | 10-125931 A | 5/1998 |
| JP | 11-020360 A | 1/1999 |
| JP | 11-026733 A | 1/1999 |
| JP | 11-026734 A | 1/1999 |
| JP | 11-074075 A | 3/1999 |
| JP | 11-097357 A | 4/1999 |
| JP | 11-198679 A | 7/1999 |
| JP | 11-232954 A | 8/1999 |
| JP | 11-243209 A | 9/1999 |
| JP | 11-260549 A | 9/1999 |
| JP | 11-312811 A | 11/1999 |
| JP | 2000-177483 A | 6/2000 |
| JP | 2001-051296 A | 2/2001 |
| JP | 2001-060697 A | 3/2001 |
| JP | 2001-118680 A | 4/2001 |
| JP | 2001-125138 A | 5/2001 |
| JP | 2001-155134 A | 6/2001 |
| JP | 2001-166301 A | 6/2001 |
| JP | 2001-189460 A | 7/2001 |
| JP | 2001-217075 A | 8/2001 |
| JP | 2001-237065 A | 8/2001 |
| JP | 2001-261864 A | 9/2001 |
| JP | 2001-513911 A | 9/2001 |
| JP | 2001-272923 A | 10/2001 |
| JP | 2001-290439 A | 10/2001 |
| JP | 2002-184959 A | 6/2002 |
| JP | 2002-217391 A | 8/2002 |
| JP | 2003-045890 A | 2/2003 |
| JP | 2003-142666 A | 5/2003 |
| JP | 2003-163338 A | 6/2003 |
| JP | 2003-203764 A | 7/2003 |
| WO | WO 92/13363 A2 | 8/1992 |
| WO | WO 93/15589 A1 | 8/1993 |
| WO | WO 93/16491 A1 | 8/1993 |
| WO | WO 93/18428 A2 | 9/1993 |
| WO | WO 94/07177 A1 | 3/1994 |
| WO | WO 94/10600 A1 | 5/1994 |
| WO | WO 94/10794 A1 | 5/1994 |
| WO | WO 94/18791 A1 | 8/1994 |
| WO | WO 95/25983 A1 | 9/1995 |
| WO | WO 98/28946 A1 | 7/1998 |
| WO | WO 98/39176 A1 | 9/1998 |
| WO | WO 99/39372 A2 | 8/1999 |
| WO | WO99/44242 A1 | 9/1999 |
| WO | WO 00/46854 A1 | 8/2000 |
| WO | WO-01/05194 | 1/2001 |

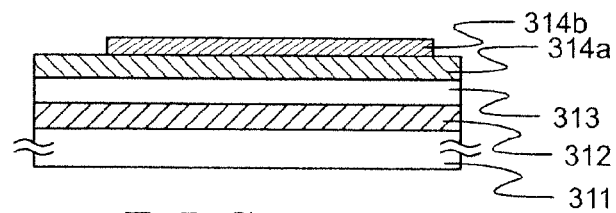
F I G. 3A
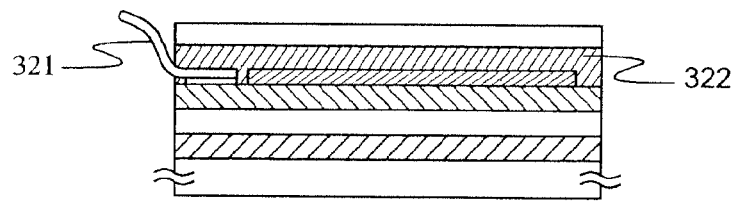
F I G. 3B
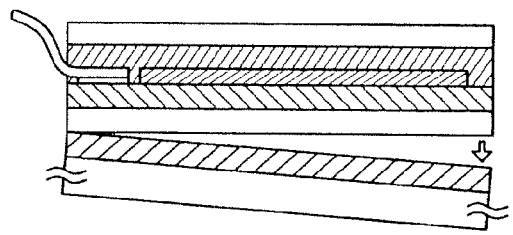
F I G. 3C
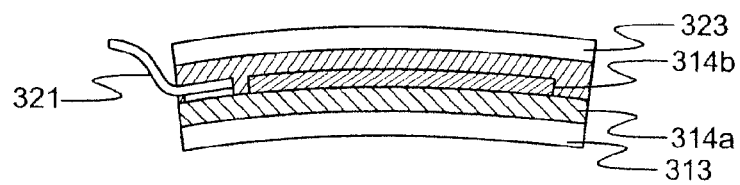
F I G. 3D
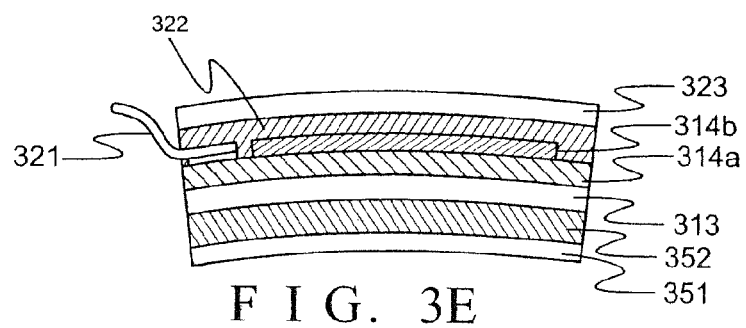
F I G. 3E F I G. 7
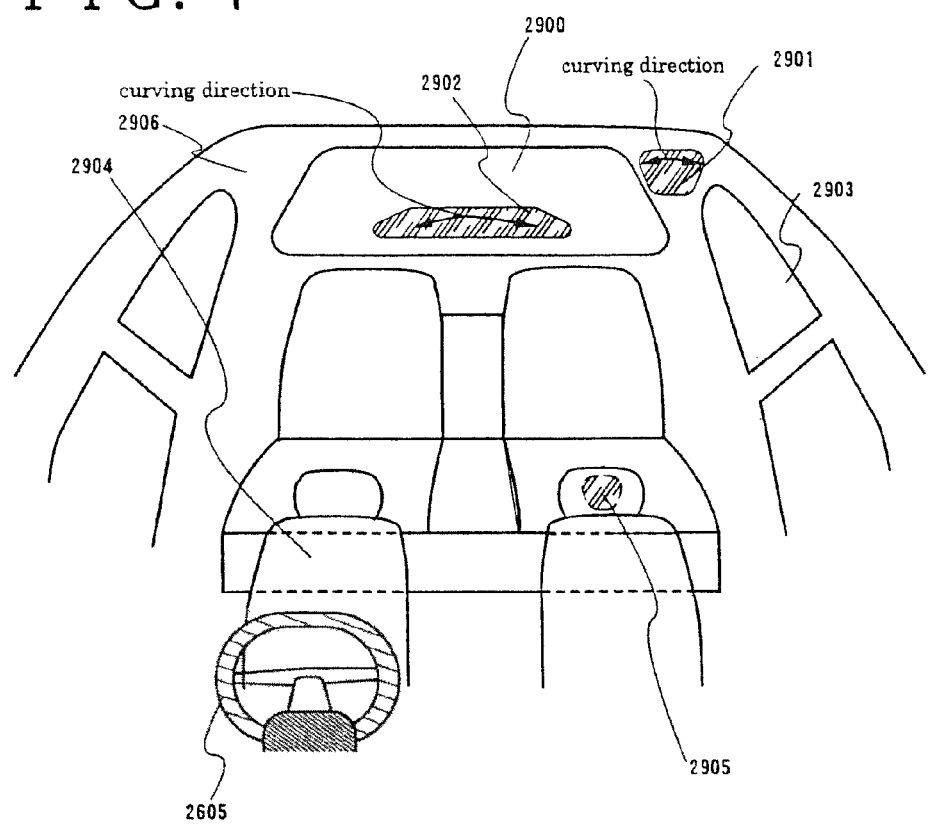

METHOD FOR FABRICATING A SEMICONDUCTOR DEVICE BY BONDING A LAYER TO A SUPPORT WITH CURVATURE

CROSS-REFERENCE TO RELATED APPLICATIONS

This application is a continuation of U.S. application Ser. No. 13/729,473, filed Dec. 28, 2012, now U.S. Pat. No. 8,610,118, which is a continuation of U.S. application Ser. No. 12/978,758, filed Dec. 27, 2010, now U.S. Pat. No. 8,344,369, which is a continuation of U.S. application Ser. No. 12/259,748, filed Oct. 28, 2008, now U.S. Pat. No. 7,858,411, which is a continuation of U.S. application Ser. No. 11/422,980, filed Jun. 8, 2006, now U.S. Pat. No. 7,446,339, which is a continuation of U.S. application Ser. No. 11/079,287, filed Mar. 15, 2005, now U.S. Pat. No. 7,060,591, which is a continuation of U.S. application Ser. No. 10/334,076, filed Dec. 27, 2002, now U.S. Pat. No. 6,953,735, which claims the benefit of a foreign priority application filed in Japan as Serial No. 2001-402016 on Dec. 28, 2001, all of which are incorporated by reference.

BACKGROUND OF THE INVENTION

The present invention relates to a method for fabricating a semiconductor device having a circuit configured of a thin film transistor (hereafter, it is called a TFT) in which a peeled layer that has been peeled is bonded and transferred to a base material, particularly to a method for transferring a circuit configured of a TFT to a support with curvature.

In recent years, a technique has been receiving attention in which a semiconductor thin film (a thickness of about a few to a few hundreds nanometers) formed over a substrate having an insulated surface is used to configure TFTs. The TFT is widely used for electronic devices such as ICs and electro-optic devices, which has been urged to develop as a switching device for image display devices.

In addition, an attempt has been made to install various display devices on vehicles such as automobiles and aircrafts, including display devices for navigation systems, operation screen display devices for audio systems, and display devices for meters.

Various applications utilizing such the image display devices are expected, however, attention is being given to the use for portable devices in particular. At present, glass and silica are mainly used for substrates, but the display devices with glass and silica substrates have disadvantages of being thick, heavy-weight and easy to crack, which particularly have disadvantages for portable devices that are highly required to be low-profile, light-weight and hard to crack. Furthermore, glass and silica are generally difficult to be formed into large-sized products, having disadvantages for mass production in particular. On this account, an attempt has been made to form TFT devices on a substrate having bendability, flexibility or elasticity, typically a flexible plastic film or sheet.

However, plastics have low heat resistance, inevitably dropping the maximum temperature in the device fabrication processes. On this account, the electric characteristics of the TFTs formed on a plastic are essentially inferior to the TFTs formed on a glass substrate. Therefore, high-performance light emitting diodes and liquid crystal display devices using plastics have not been realized yet.

SUMMARY OF THE INVENTION

When light emitting devices and liquid crystal display devices can be fabricated, which have an organic light emitting diode formed on a substrate with bendability, flexibility or elasticity, typically a plastic film or sheet, they can be used for displays and show windows having a curved surface, in addition to the characteristics of being low-profile, light-weight and hard to crack. Thus, the use is not limited only to portable devices, having the wide application range.

Furthermore, in the case where displays for images and meters are installed in limited spaces, such as the driver seat of vehicles including automobiles and aircrafts, when display devices are formed to match the curvatures with various curved surfaces of windows, ceilings, doors and dashboards beforehand, allowing installing them not only on the flat surfaces but also on the curved surfaces as they are. Traditionally, the displays have had flat surfaces, causing spaces inside the vehicles to narrow or the installation work to be complex that a wall is cut out to fit and install a flat display.

The object of the invention is to provide a method for fabricating a semiconductor device having a peeled layer bonded to a base material with curvature. Particularly, the object is to provide a method for fabricating a display with curvature, more specifically, a light emitting device having an organic light emitting diode bonded to a base material with curvature, or a liquid crystal display device bonded to a base material with curvature.

The configuration of the invention relating to the fabrication method disclosed in the specification is a method for fabricating a semiconductor device including:

a first step of forming a support and a transfer object (body) with curvature;

a second step of forming a peeled layer containing a device over a substrate having rigidity higher than that of the support;

a third step of bonding the support with curvature to the peeled layer containing the device and the substrate with an external farce applied so as to match the surface topology of the peeled layer containing the device and the substrate;

a fourth step of peeling the peeled layer containing the device bonded with the support from the substrate by a physical unit; and a fifth step of bonding the transfer object to the peeled layer containing the device to sandwich the device between the support and the transfer object, wherein the support bonded with the peeled layer containing the device fully or partially returns into the shape after the first step has been finished at the time of finishing the fourth step.

In addition, in the invention, the support is for bonding to the peeled layer in peeling by the physical unit, which is not defined particularly when it has a desired curvature and elasticity, that is, the property to exert a restoring force to return to the original shape when an external force is applied. The base materials are fine to have any composition, including plastics, glass, metals and ceramics. Furthermore, in the specification, the transfer object is for bonding to the peeled layer after peeled, which is not defined in particular when it has a desired curvature. The base materials are fine to have any composition, including plastics, glass, metals and ceramics. Particularly, when the top priority is weight saving, a film plastic substrate is preferable, such as polyethylene terephthalate (PET), polyether sulfone (PES), polyethylene naphthalate (PEN), polycarbonate (PC), nylon, polyether ether ketone (PEEK), polysulfone (PSF), polyetherimide (PEI), polyallylate (PAR), and polybutylene terephthalate (PBT).

Moreover, the configuration is characterized by $R_i \leq R_f \leq R_m$, where the curvature radius of the support after the first step is finished is the curvature radius after the third step is finished is $R_m$, and the curvature radius after the fourth step is finished is $R_f$.

Besides, the configuration is characterized in that when a light emitting device having an organic light emitting diode is formed, the support is an encapsulation material and the device is a self-luminous device.

In addition, the configuration is characterized in that when a liquid crystal display device is formed, the support is an opposite substrate and the device has a pixel electrode, in which a liquid crystal material is filled between the pixel electrode and the opposite substrate.

Furthermore, the configuration is characterized in that at least one of the support and the transfer object is transparent.

Moreover, the configuration is characterized in that the curvature radii of the support and the transfer object range from 50 to 200 cm.

Besides, in the configuration, the peeling method is not defined particularly. Such methods can be used that a separate layer is disposed between the peeled layer and the substrate and the separate layer is removed with a chemical solution (etchant) to separate the peeled layer from the substrate, and that a separate layer made of amorphous silicon (alternatively, polysilicon) is disposed between the peeled layer and the substrate and laser light is irradiated as passed through the substrate to release hydrogen contained in the amorphous silicon, whereby a clearance is generated to separate the peeled layer from the substrate. In addition, when the laser light is used for separation, devices contained in the peeled layer are desirably formed to set annealing temperatures at 410° C. or below so as not to release hydrogen before peeling.

Furthermore, as another peeling method, a peeling method may be used in which a membrane stress between two layers is utilized for peeling. This peeling method can cleanly, easily separate in an oxide layer or in the interface by a physical unit with no film removal (peeling) even through such processes, in which a metal layer, preferably a metal nitride layer is deposited on a substrate, an oxide layer is further deposited on the metal nitride layer, devices are formed over the oxide layer, and then the deposition process or annealing at temperatures of 500° C. or above is performed. For further facilitating the peeling, annealing or laser light irradiation may be performed before peeling by the physical unit.

Moreover, according to each of the fabrication methods, the display with a curved surface can be realized to allow installation in vehicles such as automobiles, aircrafts, ships and trains. The inner walls and ceilings of the vehicles have wide space as much as possible and are configured of smooth, curved surfaces not causing problems even though human bodies come up against them for any reason. It is also possible to install a display device having a TFT and an organic light emitting diode in these curved surfaces as a meter or lighting system. In addition to this, the method for driving the display device having the TFT and the organic light emitting diode is preferably the active matrix type, but it is acceptable to be the passive matrix type.

For example, the window of the vehicles is formed of a base material and the display device having the organic light emitting diode with the curvature matched with the curved surface of the window is bonded with no curve as it is, whereby images and meters can be displayed. Particularly, the display device having the organic light emitting diode can be formed to be significantly light weight, and thus space is not changed. When the display device having the organic light emitting diode is bonded to the window of the vehicles, the substrates, electrodes and wiring lines are desirably transparent, and a film for blocking the external light may be provided. Furthermore, it is preferable to confirm outside landscapes without problems when not displayed.

Moreover, along the inner walls, doors and seats of the vehicles, or along car dashboards, the display device having the organic light emitting diode with the curvature matched with the curved surfaces is bonded with no curve as it is, whereby images and meters can be displayed. It is fine only to bond the display device fabricated according to the invention along the curved surface, and thus the installation work is significantly simple, not requiring partial work to the inner walls, doors, seats and dashboards in particular. Besides, in the automobiles, for example, when the car is right-handled, a dead angle exists left backside because a part of a car body (a portion between window glasses) is there. However, when the display device fabricated according to the invention is installed in the portion between the window glasses, and a camera capable of shooting in the dead angle direction is mounted outside the car to connect them each other, a driver can confirm the dead angle. Particularly, the display device having the organic light emitting diode is the display device that is superior in moving pictures to the liquid crystal display device and has a wider viewing angle.

In addition, the ceiling of the vehicles is formed of a base material, and the display device having the organic light emitting diodes with the curvature matched with the curved surface of the ceiling is bonded with no curve as it is, whereby image display and lighting the inside can be performed. Furthermore, in the automobiles, for example, when the display devices fabricated according to the invention are bonded in the ceiling and portions between the window glasses, and cameras capable of shooting outside landscapes corresponding to the separate display devices are mounted outside the car to connect them each other, people inside the car can enjoy outside landscapes as if they seated in a convertible car. Moreover, when the display device fabricated according to the invention is bonded to the ceiling and sidewalls in trains and electric railcars, for example, advertisement display and television pictures can be displayed without narrowing the space. Particularly, the display device having the organic light emitting diode is the display device with a viewing angle wider than that of the liquid crystal display device.

In the vehicles, when the curvature radius of the curved surface in the installed display device ranges from 50 to 200 cm, the TFT and the organic light emitting diode can be driven without problems.

In addition, the semiconductor device in the invention is the devices in general which can function by utilizing the semiconductor characteristics. The electro-optic devices, the light emitting devices, the semiconductor circuits and electronic devices are all semiconductor devices.

BRIEF DESCRIPTION OF THE DRAWINGS

The teachings of the invention can be readily understood by considering the following detailed description in conjunction with the accompanying drawings, in which:

FIGS. 3A to 3E are flow charts of fabricating a semiconductor device having an organic light emitting diode (Embodiment 1);

FIG. 7 is a diagram illustrating inside the car and around a rear window (Embodiment 4)

DESCRIPTION OF THE PREFERRED EMBODIMENT

Embodiment Mode

Hereafter, the embodiments of the invention will be described by FIGS. 1A to 1E, and 2A and 2B, according to the typical fabrication procedures.

Figure 1A:
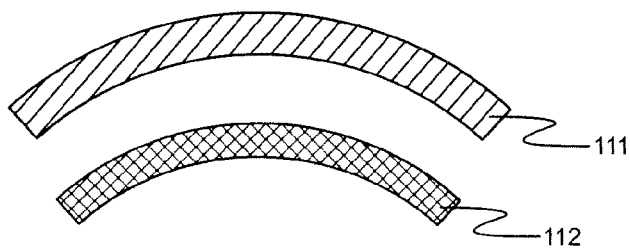
FIGS. 1A to 1E are flow charts illustrating the invention (Embodiment mode)
Figure 2A:
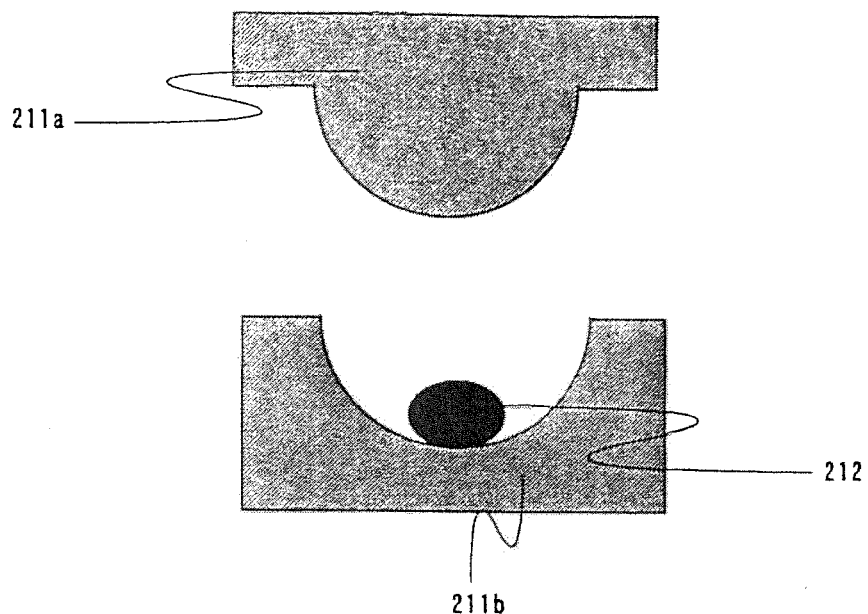
FIGS. 2A and 2B are diagrams illustrating one form of plastic molding (Embodiment mode)
Figure 2B:
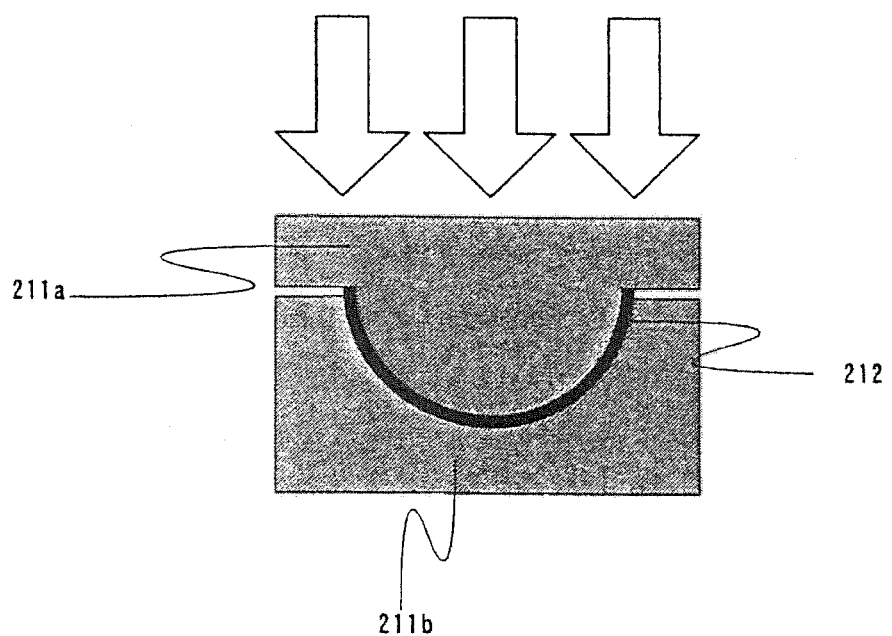

FIG. 1A shows a first step of fabricating a support 111 and a transfer object 112. It is important to fabricate them to have a desired curvature according to the purposes, particularly to fabricate the support 111 to have elasticity. The curvature radius of the support 111 after the first step is finished is defined as Ri. The row materials, material quality and shaping methods are not defined in particular. The thickness is not limited in particular as well. Typically, it is fine to have a thickness of about 100 micrometers. Generally, those having a film thickness of 200 micrometers or below are called a film, and those of 200 micrometers or greater are called a sheet. It is acceptable that the support 111 and the transfer object 112 are a film or sheet. As for the support 111, it is fine that the support is so thin that it has elasticity. Here, plastics are used for both the support 111 and the transfer object 112. With the use of general thermoplastic resins or thermosetting resins as row materials, they are shaped by general plastic molding, that is, in the course of plasticization in which a row material is heated for easy flow, shaping in which a mold is used to give a desired shape, and solidification in which the shape is stabilized by cooling or curing reaction. For example, FIGS. 2A and 2B show the steps of compression molding of a thermosetting resin. First, as shown in FIG. 2A, a thermosetting resin 212, which is heated with high flowability, is filled in a mold (female mold) 211*b*. Then, as shown in FIG. 2B, a mold (male mold) 211*a* is used to apply pressure from the direction indicated by arrows. When the molds 211*a* and 211*b* are heated as the pressure is held, the flowability of the resin drops at some point for curing. Subsequently, the molds 211*a* and 211*b* are opened to obtain a molded product.

In addition, a coating film with various functions (not shown) can be deposited in a single layer or multiple layers over the support 111 and the transfer object 112. Generally, a barrier film for blocking water and oxygen, a base film for improving the adhesion of adhesives, and a protection layer for enhancing chemical resistance and physical strength are laminated. For example, a silicon nitride thin film having a thickness of about 100 nm can be deposited over the support 111 by sputtering. However, at least one of the support 111 and the transfer object 112 needs to have a limited light transmittance, that is, to be transparent.

Figure 1B:
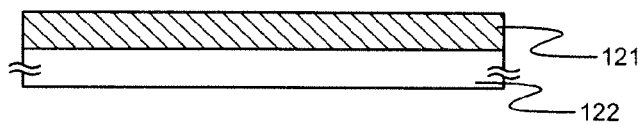

FIG. 1B shows a second step of fabricating a peeled layer 121 on a substrate 122. The peeled layer comprises various devices, typically TFTs (thin film diodes, and photoelectric conversion devices formed of pin-junctions of silicon junctions, and silicon resistance elements) and an organic light emitting diode, generally including electrodes, wiring lines and insulating films. The rigidity of the substrate 122 is set higher than that of the support 111. In FIG. 1B, the substrate 122 is illustrated so as to be fully covered with the peeled layer 121 for simplification, but it is no problem to partially expose the substrate 122.

Figure 1C:
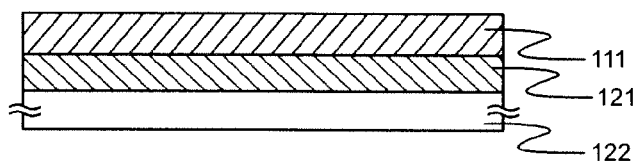

FIG. 1C shows a third step of bonding the support 111 to the substrate 122 and the peeled layer 121. First, an external force is applied to the support 111 to shape it into a form matched with the surface topology of the substrate 122 and the peeled layer 121. For example, it is fine that the support 111 originally curved as shown in FIG. 1A is stretched straight and bonded as shown in FIG. 1C. After bonded, the restoring force to return to the original shape is exerted over the support 111, but the bonded substrate 122 has higher rigidity, and thus the support 111 keeps the state of being stretched straight at this stage. More specifically, when the curvature radius of the support 111 after the third step is finished is defined as $R_m$, the curve of the support 111 becomes smoother than that after the first step is finished in general, and therefore it is generally $R_i \leq R_m$. As the bonding method, it is preferable to closely contact the support 111 with the peeled layer 121 or the support 111 with the substrate 122, but a limited space may exist inside.

Types of adhesives (not shown) and the coating method are not defined particularly. More specifically, it is acceptable that the reactive curing type, thermosetting type, photo-curing type and anaerobic type of adhesives are coated by techniques including screen printing, drawing by a dispenser and discharge by a spray. Here, a UV cure adhesive, which is one kind of the photo-curing type, is coated by a dispenser. The adhesive is coated over the support 111 or peeled layer 121, and then ultraviolet rays are irradiated, whereby the adhesive is cured. Generally, the peeled layer 121 has portions to be damaged by irradiating the ultraviolet rays. Therefore, it is fine to use a proper light shielding mask for covering the portions, and alternatively to irradiate ultraviolet rays having selective energy that cures only the adhesive and does not damage the other portions, whereby damages are avoided.

Figure 1D:
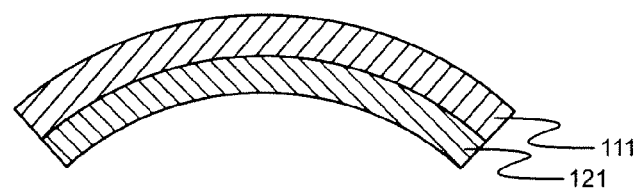

FIG. 1D shows a fourth step of peeling the peeled layer 121 from the substrate 122. The peeling method is not limited particularly. Here, the peeling method that utilizes the membrane stress between a metal layer or nitride layer and an oxide layer is used, which is not restricted by annealing temperatures and substrate types. First, a nitride layer or metal layer (not shown) is deposited over the substrate 122 before the state shown in FIG. 1B is obtained. As typical example for the nitride layer or metal layer, it is fine to use a single layer formed of an element selected from Ti, W, Al, Ta, Mo, Cu, Cr, Nd, Fe, Ni, Co, Ru, Rh, Pd, Os, Ir and Pt, an alloy material or compound material having a principal component of these elements, or a laminated layer of these, and alternatively a single layer formed of nitrides of these such as titanium nitride, tungsten nitride, tantalum nitride and molybdenum nitride or a laminated layer of these. Subsequently, an oxide layer (not shown) is deposited over the nitride layer or metal layer. As a typical example for the oxide layer, it is fine to use silicon oxide, silicon oxide nitride and metal oxide materials. In addition, it is fine to deposit the oxide layer by methods including sputtering, plasma CVD and coating. The film thickness of the nitride layer or metal layer and the oxide layer is properly set within the range of 1 to 1000 nm, whereby the membrane stress of both layers can be varied each other. Furthermore, it is acceptable that an insulating layer or a metal layer is disposed between the substrate 122 and the nitride layer or metal, layer to enhance the adhesion to the substrate 122. Then, a semiconductor layer is deposited over the oxide layer to obtain the peeled layer 121. Moreover, the peeling method does not generate film removal due to annealing in the fabrication process of the peeled layer even though the membrane stress of the oxide layer is varied from the membrane stress of the nitride layer or metal layer. Besides, the peeling method allows peeling with a relatively small force because the membrane stress of the oxide layer is varied from the membrane stress of the nitride layer or metal layer. In addition, it is also important to pay attention not to generate cracks in peeling the peeled layer 121.

As described above, the peeled layer 121 deposited over the oxide layer can be separated from the substrate 122. The important point is in that the support 111 returns into the original shape after the first step has been finished by the restoring force at this stage. In accordance with this, the peeled layer 121 bonded beneath the support 111 also curves along the support 111. When the curvature radius of the support 111 after the fourth step is finished is defined as Rf, the curve of the support 111 becomes acuter than that after the third step is finished, that is, it becomes $R_f \leq R_m$, because the support 111 returns into the shape after the first step has been finished. In the meantime, in addition to which the support ill does not have perfect elasticity in general, the peeled layer 121 is bonded thereto, and thus the curve generally becomes smoother than that after the first step has been finished, that is, it becomes $R_i \leq R_f$. Accordingly, it generally becomes $R_i \leq R_f \leq R_m$.

Figure 1E:
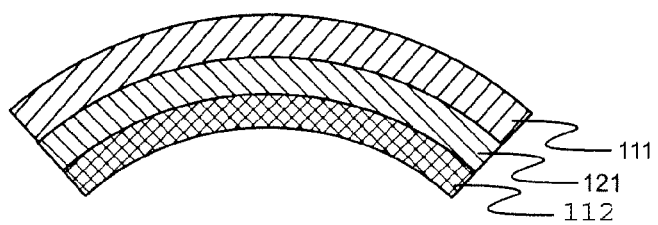

FIG. 1E shows the step of bonding the transfer object 112 to the peeled layer 121. As for the shape and thickness of the transfer object 112, they are not defined particularly when the transfer object 112 is fabricated to match the surface topology of the peeled layer 121 having curved in FIG. 1D in consideration of the shape and thickness of the support 111 and the thickness of the peeled layer 121. It is preferable to have the elasticity as similar to the support 111.

The bonding direction of the support 111 is not defined particularly in FIG. 1B. However, when a plurality of TFTs are disposed in the peeled layer 121, it is more preferable to bond the support such that the channel length of all the TFTs is arranged in the same direction and the channel direction is arranged in parallel to the direction where the support 111 does not have the curvature in FIG. 1A. It is because the influence upon the TFTs in the peeled layer 121 can be suppressed to the minimum when the support 111 bonded with the peeled layer 121 returns into the original shape by the restoring force after the substrate 122 has been peeled in FIG. 1D.

When a liquid crystal display device is fabricated, it is fine that the support is formed of an opposite substrate and the sealing material is used as an adhesive to bond the support to the peeled layer. In this case, the devices disposed in the peeled layer have pixel electrodes, and a liquid crystal material is filled between the pixel electrodes and the opposite substrate.

Furthermore, when a light emitting device is fabricated, which is typified as a device having an organic light emitting diode, the light emitting diode is preferably fully blocked from outside so as to prevent matters from entering from the outside with the use of the support as an encapsulation material, the matters such as water and oxygen facilitate the degradation of an organic compound layer. Moreover, when the light emitting device is fabricated, which is typified as a device having an organic light emitting diode, it is preferable to sufficiently protect not only the support but also the transfer object against matters so as not to enter from outside, the matters such as water and oxygen facilitate the degradation of the organic compound layer. Moreover, when it is considered important to suppress the degradation due to the penetration of water and oxygen, a thin film contacting with the peeled layer is deposited after peeling, whereby cracks generated in peeling are repaired. A film having thermal conductivity is used for the thin film contacting with the peeled layer, specifically an aluminum nitride or aluminum nitride oxide, whereby obtaining advantages to diffuse the heat from the devices and to suppress the degradation of the devices and an advantage to protect the transfer object, specifically a plastic substrate from deformation and degradation in quality. Besides, the film having the thermal conductivity also has an advantage to prevent impurities such as water and oxygen from entering from outside.

As for the invention formed of the configurations will be described further in detail with the following embodiments.

EMBODIMENT

Embodiment 1

In the embodiment, the procedures to fabricate a light emitting device having an organic light emitting diode (OLED) are shown in FIGS. 3A to 3E.

As shown in FIG. 3A, a first material layer 312 is formed over a substrate 311. As the first material layer 312, it may have compressive stress or may have tensile stress immediately after the deposition. It is important to use materials that do not generate abnormality in peeling due to annealing in forming the peeled layer and the irradiation of laser light and have tensile stress in the range of 1 to $1 \times 10^{10}$ (Dyne/cm$^2$) after the peeled layer is formed. Typically, nitrides or metals are preferable. A representative example is a single layer formed of an element selected from W, WN, TiN and TiW, an alloy material or compound material having a principal component of the elements, or a laminated layer of these. In addition, it is fine to use sputtering for the first material layer 312.

For the substrate 311, glass, silica and ceramics can be used. Furthermore, it is acceptable to use a semiconductor substrate typically silicon, or a metal substrate typically stainless steel. Here, a glass substrate (#1737) having a thickness of 0.7 mm is used.

Subsequently, a second material layer 313 is deposited over the first material layer 312. As for the second material layer 313, it is important to use materials that do not generate abnormality in peeling due to annealing in forming the peeled layer and the irradiation of laser light and have compressive stress in the range of 1 to $1 \times 10^{10}$ (Dyne/cm$^2$) after the peeled layer is formed. For the second material layer 313, oxides are preferable. A representative example is silicon oxide, silicon oxide nitride, metal oxide materials or a laminated layer of these. Moreover, it is fine to deposit the second material layer 313 by sputtering. When the second material layer 313 is deposited by sputtering, a rare gas typically argon gas is introduced into a chamber to have a slight amount of a rare gas element contained in the second material layer 313.

In the first material layer 312 and the second material layer 313, it is acceptable that the film thickness of each layer is properly set in the range of 1 to 1000 nm to adjust the internal stress in the first material layer 312 and the internal stress in the second material layer 313.

In addition, in FIGS. 3A to 3E, the embodiment is shown for simplifying the processes in which the first material layer 312 is formed as contacting with the substrate 311. However, it is fine that an insulating layer or metal layer to be a buffer layer is disposed between the substrate 311 and the first material layer 312 to enhance the adhesion to the substrate 311.

Then, a peeled layer 314a containing TFTs is formed over the second material layer 313. The peeled layer 314a includes TFTs in a pixel portion (part) (an n-channel TFT and a p-channel TFT), drive circuit TFTs disposed around the pixel portion (an n-channel TFT and a p-channel TFT), and wiring lines. Subsequently, an insulating film for covering each of the TFTs is formed, and then the cathode or the anode electrically connected to the TFTs disposed in the pixel portion is formed. After that, an insulator called a bank is formed on both ends so as to cover the end part of the cathode or the anode. Furthermore, it is fine to properly form a passivation film (protection film) formed of a nitride film so as to cover the TFTs as necessary. Moreover, as the process of forming the peeled layer 314a, annealing can be performed as resistible by the substrate 311. Besides, even though the internal stress in the second material layer 313 is varied from the internal stress in the first material layer 312, annealing treatment in the process of fabricating the peeled layer 314a will not cause film removal.

Then, a peeled layer 314b containing an organic light emitting diode is formed over the peeled layer 314a containing the TFTs. That is, an EL layer (organic compound material layer) is formed over the cathode or the anode covered with the bank. It is acceptable that the anode is disposed over the EL layer when the under layer of the EL layer is formed into the cathode, whereas the cathode is disposed over the EL layer when the under layer of the EL layer is formed into the anode.

As the EL layer, layers for injecting, transferring and recombining electron and hole carriers, that is, a light emitting layer, a carrier transport layer and a carrier injection layer are combined freely. As the organic EL materials, the low-weight molecular type, the polymer type and those combining both can be used. In addition, as the EL layer, such thin films can be used that the thin films are formed of light emitting materials capable of obtaining light emission from the singlet excitation state or triplet excitation state (generally, the former is fluorescence, and the latter is phosphorescence). For film deposition methods, the dry process such as vacuum evaporation and electron beam (EB) evaporation are general in the low weight molecular type materials, whereas the wet process such as spin coating and ink jet printing are general in the polymer type materials. Furthermore, inorganic materials such as silicon carbide can be used as the carrier transport layer and the carrier injection layer. For the organic EL materials and the inorganic materials, publicly known materials can be used. Moreover, the EL layer is formed into a thin film layer of about 100 nm in total. To this end, the surface formed as the cathode or the anode needs to enhance the flatness.

Besides, as the materials used for the cathode, it is preferable to use metals having a small work function (alkali metals and alkaline earth metals) and alloys containing these. For example, in the organic light emitting diode using an aluminium alloy (AlLi alloy) containing a slight amount of Li (lithium) for the cathode, which is one of alkali metals, the light emitting characteristics are generally excellent and the reduction in luminance is small even though lighting for long hours. Alternatively, when a single metal (Al, for example) having a work function not so small is laminated over an ultrathin film (about one nanometer) formed of oxides and fluorides of alkali metals and oxides and fluorides of alkaline earth metals, the excellent device characteristics can be similarly obtained. For example, when the structure is used in which Al is laminated over an ultrathin film of LiF instead of the AlLi alloy as the cathode, the similar characteristics can be obtained as well.

In addition, as the conductive film used for the anode, materials having a work function greater than that of the materials for forming the cathode are used. Particularly, for transparent conductive films, the tin oxide ($SnO_2$) type, zinc oxide (ZnO) type and indium oxide ($In_2O_3$) type of materials, typically ITO (indium oxide-tin oxide alloy) and IZO (indium oxide-zinc oxide alloy) are widely used. Furthermore, materials having sheet resistance lower than that of ITO, specifically platinum (Pt), chromium (Cr), tungsten (W) and nickel (Ni) can be used as well.

The steps described above, the peeled layer is formed in which the layer 314b containing the organic light emitting diode is laminated with the layer 314a containing the TFTs to be connected to the organic light emitting diode. Moreover, there are roughly two methods to control current carried through the organic light emitting diode by the TFTs. More specifically, a method of controlling current in the voltage range called the saturation region and a method of controlling current in the voltage range that reaches to the saturation region. In the specification, the Vd range where the current value is nearly constant is called the saturation region in the Vd·Id curve. The invention is not limited to the methods for driving the organic light emitting diode, which can use arbitrary driving methods.

Then, the treatment to partially reduce the adhesion of the first material layer 312 to the second material layer 313 is performed. The treatment to partially reduce the adhesions is the treatment that laser light is partially irradiated onto the second material layer or first material layer along the rim of the area to be peeled, or the treatment that a local pressure is applied from outside along the rim of the area to be peeled and the inside or interface of the second material layer is partially damaged. More specifically, it is acceptable that a hard needle is pressed vertically with a diamond pen and moved with load. Preferably, it is fine that a scriber is used, an amount to press is set from 0.1 to 2 mm and pressure is applied to move the edge of the scriber. In this manner, it is important to create a portion where the removal phenomenon tends to be generated before peeling, that is, to create a trigger. The pretreatment to selectively (partially) reduce the adhesion is performed, defects in peeling are eliminated and the yield is enhanced as well.

Subsequently, as shown in FIG. 3B, a flexible printed circuit 321 (FPC) is bonded to a terminal electrode disposed at the end part of an interconnect wiring line connected to the TFTs disposed in the peeled layer 314a.

Then, a support 323 is bonded to the peeled layers 314a and 314b with a fist adhesive 322. The support 323 originally having curvature and elasticity is bonded with the external force applied. After bonded, the restoring force is exerted over the support 323, but the substrate 311 has the higher rigidity, and thus the support does not return into the original shape at this stage. In the case of the organic light emitting diode, the support 323 is generally formed of an encapsulation material, which has functions to suppress the degradation of the EL layer, the anode and the cathode mainly caused by the penetration of external water and oxygen.

As the first adhesive 322, the reactive curing type, thermosetting type, photo-curing type and anaerobic type of adhesives are named. As the composition of the adhesives, any types are fine such as the epoxy type, the acrylate type and the silicon type. However, the organic light emitting diode is weak to water and oxygen, and thus materials having high barrier properties against water and oxygen are desirable. Such the adhesives are formed by coating, for example. In addition, it is fine to coat the adhesives over the support or the peeled layers 314a and 314b. In the embodiment, a UV cure adhesive is used for the first adhesive 322. In this case, ultraviolet rays are irradiated, whereby the first adhesive 322 is cured. The direction of irradiating ultraviolet rays is properly determined by a person to carry out according to the configuration and fabrication method of the organic light emitting diode and the circuit configuration of the pixel. That is, it is fine to irradiate the ultraviolet rays from either side, from the substrate 311 or the support 323. However, the EL layer is generally damaged by irradiating the ultraviolet rays. Therefore, attention is needed to use a light shielding mask for the portions not to be irradiated by the ultraviolet rays, or to adjust the energy of the ultraviolet rays to cure only the adhesive, whereby not damaging the other portions.

Then, the substrate 311 disposed with the first material layer 312 is peeled from the area where the adhesion has been partially reduced, and it is peeled off by a physical unit in the direction of an arrow shown in FIG. 3C. The second material layer 313 has the compressive stress and the first material layer 312 has the tensile stress, and thus they can be peeled by a relatively small force (for example, human hands, wind pressure blown from a nozzle, and ultrasonic waves).

In this manner, the peeled layers 314a and 314b formed over the second material layer 313 can be separated from the substrate 311. At this stage, the support 323 returns into the original shape by the restoring force, and in accordance with this, the layers bonded to the support 323 are also curved (FIG. 3D).

Subsequently, as shown in FIG. 3E, a transfer object 351 is bonded to the second material layer 313 (and the peeled layers 314a and 314b) with a second adhesive 352.

As the second adhesive 352, various adhesives of the reactive curing type, thermosetting type, photo-curing type, and anaerobic type are used. In the embodiment, a UV cure adhesive is used for the second adhesive 352. The direction of irradiating ultraviolet rays can be determined properly by a person to carry out according to the configuration and fabrication method of the organic light emitting diode and the circuit configuration of the pixel. That is, it is fine to irradiate from either side, from the transfer object 351 or support 323. However, as similar to the first adhesive 322, attention is needed to use a light shielding mask for covering the portions not to be irradiated by the ultraviolet rays, or to adjust the energy of the ultraviolet rays to cure only the adhesive, whereby not damaging the other portions.

According to the steps, the light emitting device having the peeled layers 314a and 314b over the second adhesive 352 and the transfer object 351 can be fabricated. Such the light emitting device is characterized by having a curvature ranging from 50 to 200 cm with no external force applied. In addition, the oxide layer 313 to be the second material layer is disposed between the second adhesive 352 and the peeled layer 314a. The light emitting device thus obtained has the second material layer 313 deposited by sputtering and has a slight amount of a rare gas element contained in the second material layer 313. Thus, the overall device can be formed flexible as well. Furthermore, the light emission from the organic light emitting diode can be extracted from the support 323 side, the transfer object 351 side or both sides. To extract light emission only from the support 323 side is called the top face emission or upper emission (also called the top emission). To extract light emission only from the transfer object 352 side is called the bottom emission or under emission. To extract light emission from both sides of the support 323 and the transfer object 352 is called the both sides emission or bi-directional emission. In any case, to extract the light emission of the organic light emitting diode to the outside, at least one of the support 323 and the transfer object 352 needs to be transparent. The light emitting direction can be determined properly by a person to carry out according to the configuration and fabrication method of the organic light emitting diode and the circuit configuration of the pixel.

Embodiment 2

In the embodiment, the procedures to fabricate a liquid crystal display device are shown in FIGS. 4A to 4E.

Figure 4A:
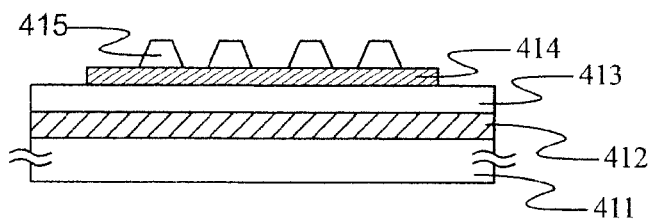
FIGS. 4A to 4E are flow charts of fabricating a semiconductor device having liquid crystals (Embodiment 2)

As shown in FIG. 4A, a first material layer 412 is deposited over the substrate 411. As the first material layer 412, it may have the compressive stress or may have tensile stress immediately after film deposition. However, it is important to use materials that do not generate abnormality in peeling due to annealing in forming the peeled layer and the irradiation of laser light and have the tensile stress in the range of 1 to $1\times10^{10}$ (Dyne/cm$^2$) after the peeled layer is formed. Typically, nitrides or metals are preferable. A representative example is a single layer formed of an element elected from W, WN, TiN and TiW, an alloy material or a compound material having a principal component of these elements, or a laminated layer of these. In addition, it is fine to use sputtering for the first material layer 412.

As the substrate 411, glass, silica and ceramics can be used. Furthermore, a semiconductor substrate typically silicon, or a metal substrate typically stainless steel may be used. Here, a glass substrate (#1737) having a thickness of 0.7 mm is used.

Subsequently, a second material layer 413 is formed over the first material layer 412. As the second material layer 413, it is important to use materials that do not generate abnormality in peeling due to annealing in forming the peeled layer and the irradiation of laser light and have the compressive stress in the range of 1 to $1\times10^{10}$ (Dyne/cm$^2$) after the peeled layer is formed. As the second material layer 413, oxides are preferable. A representative example is silicon oxide, silicon oxide nitride and metal oxide materials, or a laminated layer of these. Moreover, it is fine to use sputtering to deposit the second material layer 413. When the second material layer 413 is deposited by sputtering, a rare gas typically argon gas is introduced into a chamber to contain a slight amount of a rare gas element in the second material layer 413.

In the first material layer 412 and the second material layer 413, the film thickness of each layer is properly set within the range of 1 to 1000 nm to adjust the internal stress in the first material layer 412 and the internal stress in the second material layer 413.

In addition, in FIGS. 4A to 4E, the embodiment is shown that the first material layer 412 is formed as contacting with the substrate 411 for simplifying the processes. However, it is acceptable that an insulating layer or metal layer to be a buffer layer is disposed between the substrate 411 and the first material layer 412 to enhance the adhesion to the substrate 411.

Then, a peeled layer 414 is formed over the second material layer 413. A peeled layer 414a includes TFTs (n-channel TFTs) in the pixel portion, pixel electrodes, retention capacitances, drive circuit TFTs (n-channel TFTs and p-channel TFTs) around the pixel portion, and wiring lines. In the embodiment, the reflective liquid crystal display device is considered in which only external lights are utilized to obtain light emission. In this case, it is fine to use metals having high photoreflectance such as aluminum and silver for the pixel electrode. Furthermore, even though the internal stress in the second material layer 413 is varied from the internal stress in the first material layer 412, film removal is not generated due to annealing in the fabrication process of the peeled layer 414.

Subsequently, an alignment layer is formed over the pixel portion in the peeled layer 414 and rubbed in one direction. Therefore, the orientation of liquid crystal molecules that will be filled later can be aligned in one direction. After that, pillar or spherical spacers 415 are formed by patterning or spraying.

Accordingly, the thickness of the layer of liquid crystals that will be filled later can be controlled.

Then, the treatment is performed in which the adhesion of the first material layer 412 to the second material layer 414 is partially reduced. The treatment of partially reducing the adhesion is the treatment that laser light is partially irradiated onto the second material layer or the first material layer along the rim of the area to be peeled, or the treatment that a local pressure is applied from outside along the rim of the area to be peeled and the inside or interface of the second material layer is partially damaged. More specifically, it is acceptable that a hard needle is pressed vertically with a diamond pen and moved with load. Preferably, it is fine that a scriber is used, an amount to press is set from 0.1 to 2 mm and pressure is applied to move the needle. In this manner, it is important to create a portion where the removal phenomenon tends to be generated before peeling, that is, to create a trigger. The pretreatment to selectively (partially) reduce the adhesion is performed, whereby defects in peeling are eliminated and the yield is enhanced as well.

Figure 4B:
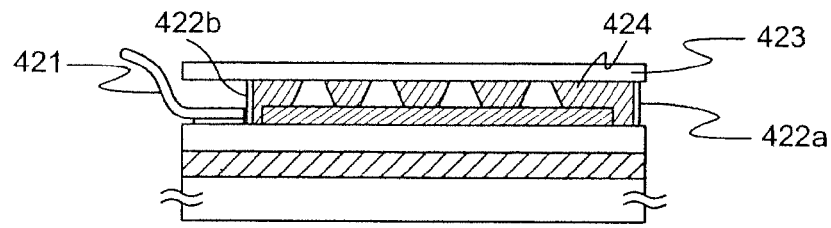

Subsequently, as shown in FIG. 4B, an FPC 421 is bonded to a terminal electrode disposed at the end part of an interconnect wiring line connected to the TFTs disposed in the peeled layer 414.

Then, a support 423 is bonded to the substrate 411 (accurately, it is the oxide layer 413) with sealing agents 422a and 422b. However, in order to fill liquid crystals later, a filling port is disposed as 422a. The support 423 originally having curvature and elasticity is bonded with the external force applied. After bonded, the restoring force is exerted over the support 423, but the substrate 411 has a higher rigidity. Thus, the support does not return into the original shape at this stage. The existence of the spacers 415 allows the interval between the support 423 and the substrate 411 to be kept constant. In the liquid crystal display device, the support 423 is generally the opposite substrate, which is considered to have a color filter, a polarizer, a common electrode and an alignment layer (not shown) formed thereon beforehand. In the reflective liquid crystal display device, it is fine to use a transparent conductive film (ITO or IZO) for the common electrode.

As the sealing agents 422a and 422b, the reactive curing type, thermosetting type, photo-curing type and anaerobic type of adhesives are named. As the composition of the sealing agents, any sealing agents are fine such as the epoxy type, acrylate type, and silicon type. The formation of such the sealing agents is performed by coating. Furthermore, it is fine to coat the sealing agents over the support 423 side or the substrate 411 side. In the embodiment, a UV cure sealing agent is used for the sealing agent 422. In this case, ultraviolet rays are irradiated, whereby the sealing agent 422 is cured. The direction of irradiating the ultraviolet rays may be from the support 423 or may be from the substrate 411. However, attention is needed to use a light shielding mask for the portions to be damaged by the ultraviolet rays, or to adjust the energy of the ultraviolet rays to cure only the sealing agent, whereby not damaging the other portions.

After that, liquid crystals 424 are filled from the filling port, and then the filling port is fully sealed with an end-sealing material (not shown). As the composition of the end-sealing material, any end-sealing materials are fine such as the epoxy type, acrylate type, and silicon type.

Figure 4C:
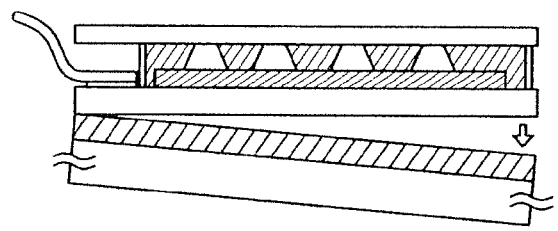

Subsequently, the substrate 411 disposed with the first material layer 412 is peeled from the area where the adhesion has been partially reduced, and it is peeled by a physical unit in the direction of an arrow shown in FIG. 4C. The second material layer 414 has the compressive stress and the first material layer 412 has the tensile stress, and thus they can be peeled with a relatively small force (for example, human hands, wind pressure blown from a nozzle, and ultrasonic waves).

Figure 4D:
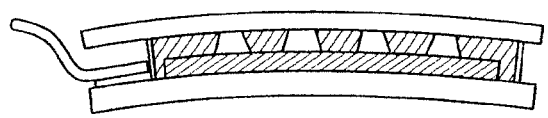

In this manner, the peeled layer 414 formed over the second material layer 413 can be separated from the substrate 411. At this stage, the support 423 returns into the original shape by the restoring force, and in accordance with this, the layers bonded to the support 423 are curved as well (FIG. 4D).

Figure 4E:
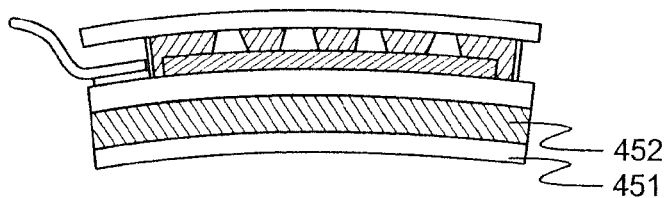

Then, as shown in FIG. 4E, a transfer object 451 is bonded to the second material layer 413 with an adhesive 452. As the adhesive 452, various adhesives of the reactive curing type, thermosetting type, photo-curing type, and anaerobic type are used. In this embodiment, a UV cure adhesive is used for the adhesive 452. It is fine to irradiate ultraviolet rays from either side, from the transfer object 451 or the support 423. However, attention is needed to use a light shielding mask for the portions not to be irradiated by the ultraviolet rays, or to adjust the energy of the ultraviolet rays to cure only the adhesive, whereby not damaging the other portions.

According to the steps described above, the liquid crystal display device having the peeled layer 414 over the second adhesive 452 and the transfer object 451 can be fabricated. Such the semiconductor device is characterized by having a curvature of 50 to 200 cm with no external force applied. Moreover, the oxide layer 413 to be the second material layer is disposed between the adhesive 452 and the peeled layer 414. The liquid crystal display device thus obtained has the second material layer 413 deposited by sputtering and has a slight amount of a rare gas element contained in the second material layer 413. The overall device can be formed flexible as well.

Besides, in the embodiment, the reflective liquid crystal display device is considered, and thus the light emission can be obtained from the support 423 side. To this end, the support 423 needs to be transparent.

Embodiment 3

Figure 5:
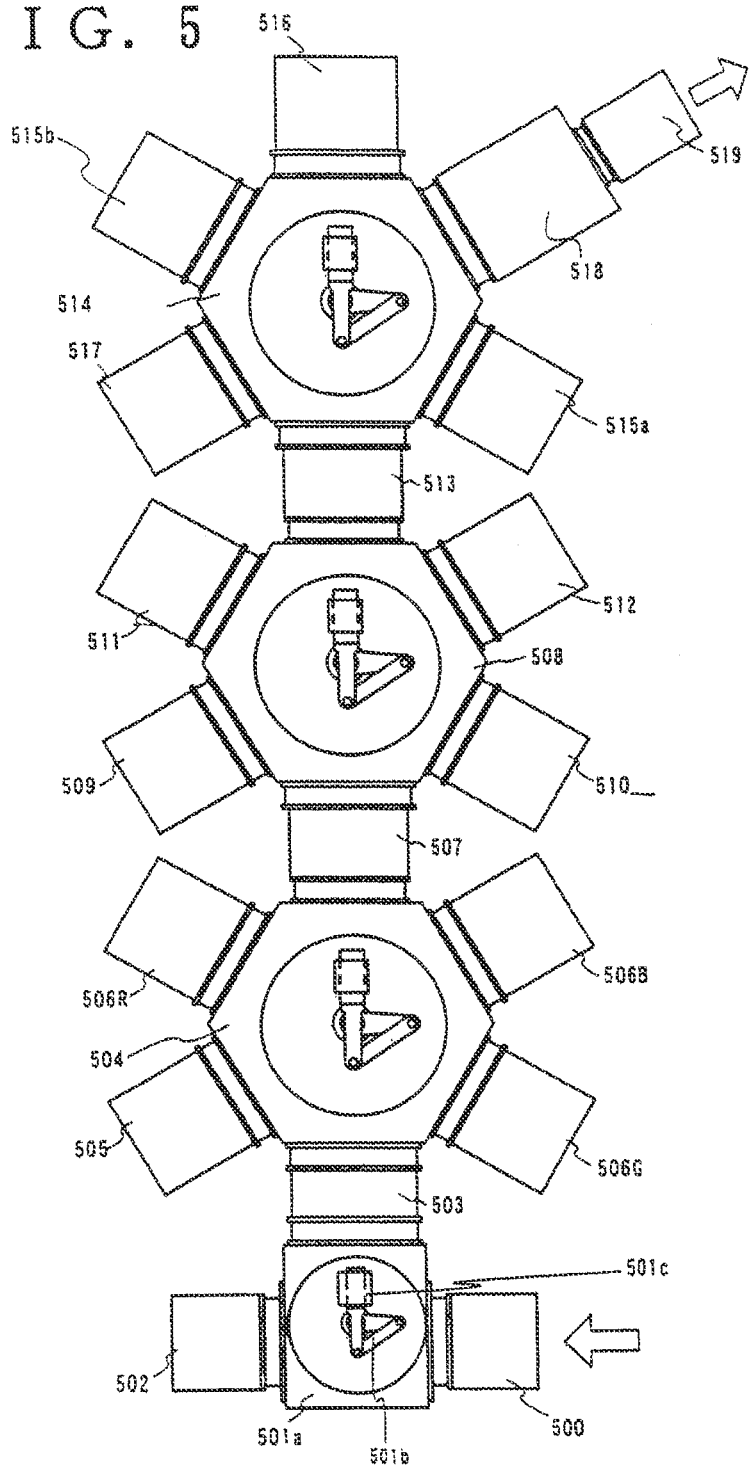
FIG. 5 is a diagram of an apparatus for fabricating a semiconductor device having an organic light emitting diode with the invention (Embodiment 3)

In the embodiment, FIG. 5 shows an apparatus for fabricating a light emitting device having an organic light emitting diode. In addition, the apparatus shown in the embodiment allows fabricating the light emitting device shown in the embodiment 1.

FIG. 5 shows an apparatus for depositing a light emitting layer (EL layer) of the organic light emitting diode by the dry deposition method of low weight molecular organic compounds. The apparatus is mainly configured of transport chambers for transferring substrates, delivery chambers for delivery, deposition chambers for depositing various thin films, and an encapsulation chamber for encapsulation. Each chamber is equipped with an exhaust system for achieving necessary vacuum degrees or a system for generating a gas atmosphere such as $N_2$. In addition, the separate chambers are connected by gate valves. The substrates are transferred by transfer robots.

First, a substrate 501c necessary to fabricate an organic light emitting diode, which has been formed with a pixel portion, a drive circuit part, wiring lines, electrodes and a protection film beforehand, is introduced into a delivery chamber 500 from outside. Typically, TFTs are used for the pixel portion and the drive circuit part.

The substrate 501c introduced into the delivery chamber 500 is carried to a transport chamber 501a by a transfer robot 501b and further carried to a pretreatment chamber 502. Typically, the substrate 501c is heated or undergoes pretreatment such as $O_2$ plasma processing in the pretreatment chamber 502. The pretreatment is intended to enhance various characteristics of the organic light emitting diode.

The substrate after the pretreatment is carried to a transport chamber 504 through a delivery chamber 503. The transport chamber 504 is also installed with a transfer robot serving to transfer substrates to the separate chambers connected to the transport chamber 504. The transport chamber 504 is connected to deposition chambers for depositing organic layers. In consideration of fabricating a display device having an organic light emitting diode of full color display, provided are deposition chambers 506R, 506G and 506B for forming light emitting layers of red, green and blue, and a deposition chamber 505 for depositing common layers for each color, that is, a carrier transport layer and a carrier injection layer. In these deposition chambers, vacuum evaporation is used in general. To obtain full color emission, it is acceptable to use a shadow mask for separately applying colors for evaporation so as to arrange the light emitting layers expressing the red, green and blue colors in stripes, mosaics or delta shapes.

The substrate after the deposition of the organic layers is carried to a transport chamber 508 through a delivery chamber 507. The transport chamber 508 is also installed with a transfer robot for serving to transfer substrates to each chamber connected to the transport chamber 508. The transport chamber 508 is connected to deposition chambers for forming a backside electrode and protection films. In deposition chambers 509 and 510, metals (such as AlLi alloy or MgAg alloy) to be electrodes are deposited by vacuum evaporation and electron beam evaporation. In a deposition chamber 511, a transparent conductive film (such as ITO or IZO) necessary to obtain light emission from the top face of the substrate is deposited by sputtering or chemical vapor deposition (CVD) in general. In a deposition chamber 512, a passivation film (such as SiN and SiOx films) for protecting the surface is deposited by sputtering or CVD in general.

The substrate after the deposition is carried to a transport chamber 514 through a delivery chamber 513. The transport chamber 514 is connected to a plurality of chambers necessary for encapsulation. The transport chamber 514 is also installed with a transfer robot for serving to transport substrates or encapsulation substrates to each chamber connected to the transport chamber 514.

First, substrates for encapsulation need to be prepared. The chambers for the purpose are an encapsulation glass substrate preparation chamber 515a and an encapsulation plastic substrate preparation chamber 515b.

To the encapsulation glass substrate preparation chamber 515a, an opposite glass for encapsulating the fabricated organic light emitting diode with glass is introduced from outside. A desiccant for protecting the organic light emitting diode against water can be introduced into the opposite glass as necessary. For example, it is fine to bond a sheet-shaped desiccant to the spot-faced recess of the opposite glass where spot facing has been applied beforehand with a double-face tape.

In the meantime, in the encapsulation plastic substrate preparation chamber 515b, encapsulation is prepared for encapsulating the fabricated organic light emitting diode with plastic. It is fine to introduce a plastic (finished product) having a shape matched to the purpose from outside. In the embodiment, however, a support (it is plastic in the embodiment) of the invention is fabricated in the encapsulation plastic substrate preparation chamber 515b. For example, the support with curvature and elasticity is fabricated according to the materials and methods described by FIGS. 2A and 2B. More specifically, the molds 211a and 211b and the thermosetting resin 212 are introduced from outside for shaping such as heating, pressing and cooling. When the organic light emitting diode is transferred onto a plastic, it is fine to fabricate the transfer object in the invention as well in the similar manner. The work may be fully automated or may be partially manually operated by disposing gloves.

The prepared encapsulation glass substrate or encapsulation plastic substrate is carried to a dispenser chamber 516 and an adhesive (not shown) for bonding it to a substrate later is applied. In the embodiment, an adhesive of the UV curable type is used for the adhesive. Furthermore, a desiccant for protecting the organic light emitting diode from water (not shown) may be disposed in the dispenser chamber 516 not in introducing the glass substrate into the encapsulation glass substrate preparation chamber 515a. For example, a sheet-shaped desiccant can be bonded to the spot-faced recess of the opposite glass where spot facing has been applied with a double-face tape. Accordingly, the desiccant does not need to be handled in the atmosphere. As for the work, it may be fully automated or may be partially manually operated by disposing gloves. Particularly, when the encapsulation plastic substrate has curvature and elasticity, the adhesive may be coated with the substrate curved or may be coated with it stretched straight.

The substrate after deposition and the encapsulation glass substrate or encapsulation plastic substrate coated with the adhesive are carried to an encapsulation chamber 517, and they are bonded to each other. It is necessary to use a proper jig (not shown) to press them in bonding. It is fine to bond the encapsulation plastic substrate with curvature and elasticity with it stretched straight. As for the work, it may be fully automated or may be partially manually operated by disposing gloves.

Subsequently, the substrate and the encapsulation substrate, which have been bonded to each other in the encapsulation chamber 517, are carried to a UV irradiation chamber 518 and ultraviolet rays for curing the adhesive are irradiated onto them.

It is fine to bring the substrate and the encapsulation substrate out of a delivery chamber 519 to outside, which have been bonded in the UV irradiation chamber 518.

However, when the device in the invention is fabricated, two steps are further needed, removing the substrate and bonding the transfer object as shown in FIGS. 1D and 1E. More specifically, the substrate and the encapsulation substrate (support), which have been bonded in the UV irradiation chamber 518, are again brought back to the encapsulation plastic substrate preparation chamber 515b. The substrate is peeled in the encapsulation plastic substrate preparation chamber 515b. In the embodiment, the method of utilizing the membrane stress between the metal layer or nitride layer and the oxide layer is used for the peeling method. In the meantime, as similar to the support, the transfer object is carried to the dispenser chamber 516 from the encapsulation plastic substrate preparation chamber 515b, and the adhesive is applied to it. The support peeled off the substrate and the transfer object coated with the adhesive are carried to the encapsulation chamber 517, and they are bonded to each other. After that, they are carried to the UV irradiation chamber 518 for UV irradiation, whereby the display device is completed. Finally, it is fine to bring the finished product out of the delivery chamber 519 to outside.

Besides, the embodiment can be combined with the embodiment 1.

Embodiment 4

The embodiment shows the example of installing the display with curvature obtained by the invention on a vehicle.

Here, an automobile was used as a typical example of the vehicles, but the invention is not limited particularly, without saying that it can be adapted to aircrafts, trains and electric railcars.

Figure 6:
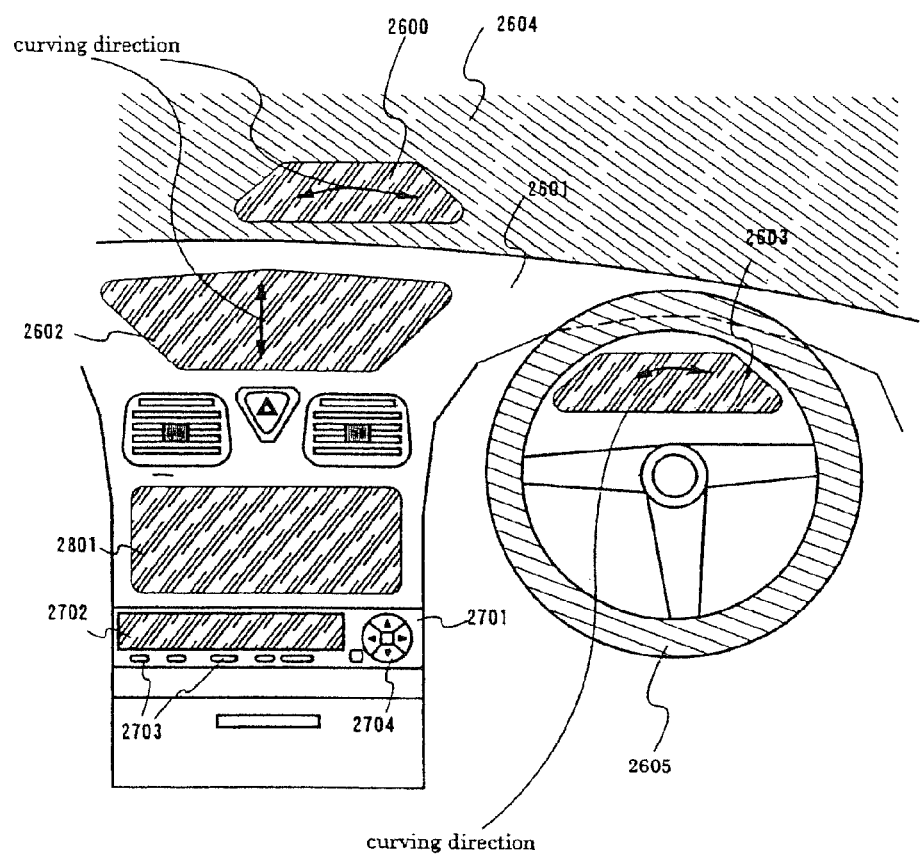
FIG. 6 is a diagram illustrating inside a car and around an automobile windowshield (Embodiment 4)

FIG. 6 is a diagram illustrating around the driver seat of an automobile. In a dashboard part, audio systems, specifically a car audio system and a navigation system, are disposed. A main body 2701 of the car audio system includes a display part 2702, and operating switches 2703 and 2704. The invention is implemented to the display part 2702, whereby a low-profile, light-weight car audio system can be completed. In addition, the invention is implemented to a display part 2801 of the car navigation system, whereby a low-profile, light-weight car navigation system can be completed.

Furthermore, near an operating handle part 2605, a display part 2603 for digital display of meters such as a speedmeter is formed on the dashboard part 2601. The invention is implemented to the display part 2702, whereby a low-profile, light-weight display for meters can be completed.

Moreover, it is fine to form a display part 2602 bonded to the dashboard part 2601 with a curved surface. The invention is implemented to the display part 2602, whereby a low-profile, light-weight display for meters or image display device can be completed. Besides, the display part 2602 is curved in the directions indicated by arrows.

In addition, it is fine to form a display part 2600 bonded to an automobile windshield 2604 with a curved surface. When the invention is implemented to the display part 2600, it is acceptable to use transparent materials. The invention allows completing a low-profile, light-weight display for meters or image display device. Furthermore, the display part 2600 is curved in the directions indicated by arrows. Here, the automobile windshield is exemplified, but the display part can be disposed over the other window glasses.

For example, it is fine to form a display part 2902 bonded to a rear window 2900 with a curved surface. FIG. 7 is a diagram illustrating around the back seat of the automobile. Moreover, FIG. 7 corresponds to FIG. 6, and the operating handle part is the same, thus using the same reference numerals and signs as those in FIG. 6.

In addition, when a flexible display device of the invention is bonded to the rear window 2900 and a camera capable of shooting backside is mounted outside the car to connect them each other, a driver can see places where an automobile body 2906 hiders the driver from seeing. Furthermore, the display part 2902 is curved in the directions indicated by arrows.

Moreover, as shown in FIG. 7, when the car is right-handled, a dead angle exists left backside because a part of the automobile body 2906 (a portion between window glasses) is there. However, when the display device of the invention (a display part 2901) is bonded to the portion between the window glasses and a camera capable of shooting the direction of the dead angle is mounted outside the car to connect them each other, the driver can confirm the dead angle. Besides, the display part 2901 is curved in the directions indicated by arrows.

In addition, it is acceptable to dispose a display part 2905 over a seat 2904. A person seated in the back seat can watch the television or can see the display of the car navigation system.

Furthermore, as not shown in the drawing here, a car ceiling is formed of a base material to bond a display device having an organic light emitting diode with a shape matched with the curved surface of the ceiling, whereby allowing image display or lighting the inside of the car.

In this manner, the display with a curved surface of the invention can be installed easily anywhere in the car with curved surfaces having a curvature radius of 50 to 200 cm.

Moreover, the embodiment shows the displays for the car audio system and the car navigation system for automobile use, but they can be used for displays for other vehicles or floor audio systems and navigation systems.

Besides, the embodiment can be combined with the embodiments 1 and 2.

Embodiment 5

In the embodiment, devices and the peripheral structure contained in the peeled layer are shown. Here, the cross-sectional structure of a single pixel in the active matrix display device, particularly the connection between a light emitting device and a TFT, and the form of a separator disposed between pixels will be described.

Figure 8A:
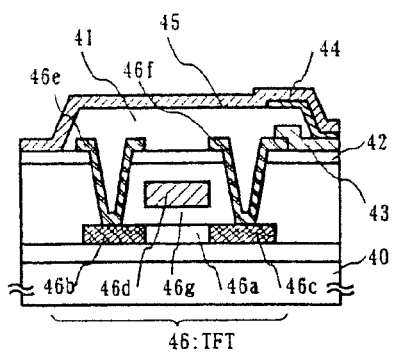
FIG. 8A-F are diagrams illustrating the cross sections around TFTs and light emitting diodes contained in peeled layers (Embodiment 5).

In FIG. 8A, reference numeral 40 denotes a substrate, reference numeral 41 denotes a separator (also called a bank), reference numeral 42 denotes an insulating film, reference numeral 43 denotes a first electrode (anode), reference numeral 44 denotes a layer including an organic compound, reference numeral 45 denotes a second electrode (cathode), and reference numeral 46 denotes a TFT.

In the TFT 46, 46a denotes a channel forming region, reference numeral 46b and reference numeral 46c denote a source region or drain region, reference numeral 46d denotes a gate electrode, and reference numeral 46e and reference numeral 46f denote a source electrode or drain electrode. A top gate TFT is shown here, but the TFT is not defined particularly, it may be an inversely staggered TFT or may be a staggered TFT. In addition, reference numeral 46f is the electrode that is partially overlapped with the first electrode 43, whereby connecting it to the TFT 46.

Figure 8B:
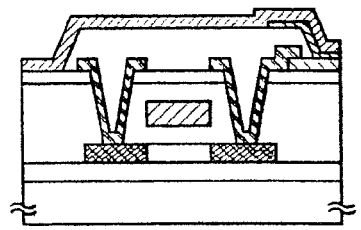

Furthermore, FIG. 8B shows the cross-sectional structure partly different from that in FIG. 8A.

In FIG. 8B, the manner to overlap the first electrode with the electrode is varied from the structure shown in FIG. 8A. The first electrode is patterned and then the electrode is formed so as to partially overlap with the first electrode, whereby connecting to the TFT.

Figure 8C:
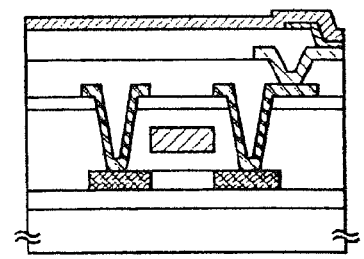

Moreover, FIG. 8C shows the cross-sectional structure partly different from that in FIG. 8A.

In FIG. 8C, one layer of an interlayer dielectric is further disposed, and a first electrode is connected to the electrode of a TFT through a contact hole.

Figure 8D:
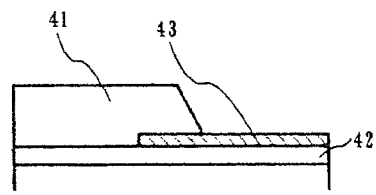

Besides, as the cross-sectional form of the separator 41, it may be formed into a tapered shape as shown in FIG. 8D. The separator can be obtained in which a resist is exposed by the photolithographic technique and then a non-photosensitive organic resin or inorganic insulating film is etched.

Figure 8E:
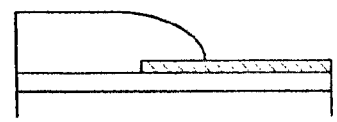
Figure 8F:
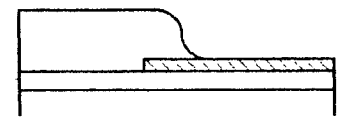

In addition, when a positive photosensitive organic resin is used, the shape shown in FIG. 8E can be formed, the shape having a curved surface in the upper end part.

Furthermore, when a negative photosensitive organic resin is used, the shape shown in FIG. 5F can be formed, the shape having a curved surface in the upper end part and the lower end part.

Moreover, the embodiment can be combined with any of the embodiments 1, 3 and 4.

Embodiment 6

The embodiment shows an example of fabricating a passive matrix light emitting device (also called a simple matrix light emitting device).

First, over a substrate, a plurality of first wiring lines is formed in stripes with a material such as ITO (a material to be an anode). Subsequently, a separator made of a resist or photosensitive resin is formed as surrounding the area to be a light emitting area. Then, a layer containing organic compounds is formed in the area surrounded by the separator by evaporation or ink jet printing. When a full color display is formed, materials are properly selected to form the layer containing the organic compounds. After that, over the separator and the layer containing the organic compounds, a plurality of second wiring lines in stripes is formed with a metal material such as Al or Al alloy (a material to be a cathode) so as to cross the plurality of first wiring lines formed of ITO. According to the steps described above, the peeled layer containing the light emitting diode forming the layer containing the organic compounds into the light emitting layer can be fabricated.

Subsequently, an encapsulation substrate to be the support is bonded with a sealing material. Alternatively, a protection film is disposed over the second wiring lines for encapsulation.

Then, the substrate is peeled and the peeled layer containing the light emitting diode is bonded to the transfer object (for example, a glass substrate with a curved surface). The method for peeling the substrate is not defined particularly. It is fine to use the methods shown in the embodiment mode and the embodiment 1 are used.

In addition, the invention can be implemented not only to the full color display device but also to a monochromatic light emitting device, such as a surface light source and an illumination system.

Furthermore, the embodiment can be freely combined with the embodiments 1, 3, 4, and 5.

According to the invention, displays can be installed in various portions with a curved surface (including windows, ceilings, doors and dashboards) in the limited space, such as the driver seat of vehicles, typically automobiles and aircrafts.

What is claimed is:

1. A method for fabricating a display device, the method comprising the steps of:
    forming a first layer containing metal over a first substrate;
    forming a second layer containing metal and oxygen over the first layer containing metal;
    forming a third layer containing a thin film transistor over the second layer containing metal and oxygen;
    forming a fourth layer containing a light emitting element over the third layer containing the thin film transistor;
    bonding a second flexible substrate with curvature to the fourth layer containing the light emitting element;
    peeling the third layer containing the thin film transistor and the fourth layer containing the light emitting element bonded to the second flexible substrate from the first substrate; and
    bonding a third substrate to the third layer containing the thin film transistor to sandwich the third layer containing the thin film transistor and the fourth layer containing the light emitting element between the second flexible substrate and the third substrate.

2. The method for fabricating the display device according to claim 1, wherein the second flexible substrate with curvature comprises plastic.

3. The method for fabricating the display device according to claim 1, wherein the third substrate comprises plastic.

4. The method for fabricating the display device according to claim 1, wherein the third substrate is flexible.

5. The method for fabricating the display device according to claim 1, wherein a first adhesive is used in the step of bonding the second flexible substrate with curvature to the fourth layer containing the light emitting element.

6. The method for fabricating the display device according to claim 1, wherein a second adhesive is used in the step of bonding the third substrate to the third layer containing the thin film transistor.

7. The method for fabricating the display device according to claim 1, further comprising the step of: attaching the display device to a main body, a window, or a seat of a vehicle.

8. The method for fabricating the display device according to claim 1, further comprising the step of: attaching the display device to a main body, a window, a dashboard part, an automobile body or a seat of an automobile.

9. A method for fabricating a display device, the method comprising the steps of:
    forming a first layer containing metal over a first substrate;
    forming a second layer containing metal and oxygen over the first layer containing metal;
    forming a third layer containing a thin film transistor over the second layer containing metal and oxygen;
    forming a spacer over the third layer containing the thin film transistor,
    bonding a second flexible substrate with curvature to the second layer containing metal and oxygen using a seal agent;
    filling a space surrounded by the second layer containing metal and oxygen, the second flexible substrate and the seal agent with liquid crystal;
    peeling the third layer containing the thin film transistor from the first substrate; and
    bonding a third substrate to the third layer containing the thin film transistor to sandwich the third layer containing the thin film transistor, the spacer, the seal agent and the liquid crystal between the second flexible substrate and the third substrate.

10. The method for fabricating the display device according to claim 9, wherein the second flexible substrate with curvature comprises plastic.

11. The method for fabricating the display device according to claim 9, wherein the third substrate comprises plastic.

12. The method for fabricating the display device according to claim 9, wherein the third substrate is flexible.

13. The method for fabricating the display device according to claim 9, wherein a first adhesive is used in the step of bonding the third substrate to the third layer containing the thin film transistor.

14. The method for fabricating the display device according to claim 9, further comprising the step of: attaching the display device to a main body, a window, or a seat of a vehicle.

15. The method for fabricating the display device according to claim 9, further comprising the step of: attaching the display device to a main body, a window, a dashboard part, an automobile body or a seat of an automobile.

* * * * *